(12) United States Patent
Greene et al.

(10) Patent No.: US 10,128,239 B2
(45) Date of Patent: Nov. 13, 2018

(54) PRESERVING CHANNEL STRAIN IN FIN CUTS

(71) Applicant: International Business Machines Corporation, Armonk, NY (US)

(72) Inventors: Andrew M. Greene, Albany, NY (US); Dechao Guo, Niskayuna, NY (US); Ravikumar Ramachandran, Pleasantville, NY (US); Rajasekhar Venigalla, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 26 days.

(21) Appl. No.: 15/294,906

(22) Filed: Oct. 17, 2016

(65) Prior Publication Data
US 2018/0108655 A1     Apr. 19, 2018

(51) Int. Cl.
| | | |
|---|---|---|
| *H01L 21/336* | (2006.01) | |
| *H01L 27/088* | (2006.01) | |
| *H01L 21/8234* | (2006.01) | |
| *H01L 21/308* | (2006.01) | |
| *H01L 29/66* | (2006.01) | |
| *H01L 21/311* | (2006.01) | |

(Continued)

(52) U.S. Cl.
CPC ...... *H01L 27/0886* (2013.01); *H01L 21/3081* (2013.01); *H01L 21/30625* (2013.01); *H01L 21/31116* (2013.01); *H01L 21/31144* (2013.01); *H01L 21/823431* (2013.01); *H01L 21/823468* (2013.01); *H01L 21/823481* (2013.01); *H01L 29/0649* (2013.01); *H01L 29/6653* (2013.01); *H01L 29/6656* (2013.01); *H01L 29/66545* (2013.01)

(58) Field of Classification Search
CPC ....... H01L 29/66545; H01L 21/823431; H01L 29/66795; H01L 27/0886; H01L 29/785; H01L 29/6653; H01L 29/0649; H01L 21/823437; H01L 27/1211; H01L 29/0847; H01L 21/823814; H01L 21/823821; H01L 27/09
See application file for complete search history.

(56) References Cited

U.S. PATENT DOCUMENTS

| | | |
|---|---|---|
| 8,269,283 B2 | 9/2012 | Cea et al. |
| 8,569,152 B1 | 10/2013 | Basker et al. |
| 8,637,359 B2 | 1/2014 | Chang et al. |

(Continued)

*Primary Examiner* — Robert Bachner
(74) *Attorney, Agent, or Firm* — Vazken Alexanian; Ryan, Mason & Lewis, LLP

(57) ABSTRACT

A method of forming a semiconductor structure includes forming a fin cut mask over a region in a fin field-effect transistor (finFET) structure. The finFET structure includes one or more fins and one or more gates and source/drain regions formed over the one or more fins in active regions of the finFET structure. The method also includes performing a fin cut by removing a portion of at least one fin. The portion of the at least one fin is determined by an exposed area of the fin cut mask. The exposed area of the fin cut mask includes at least a portion of the at least one fin between a first dummy gate and a second dummy gate formed over the at least one fin. The method further includes removing the fin cut mask and depositing an oxide to replace the portion of the at least one fin removed during the fin cut.

12 Claims, 8 Drawing Sheets

(51) Int. Cl.
*H01L 29/06* (2006.01)
*H01L 21/306* (2006.01)

(56) References Cited

U.S. PATENT DOCUMENTS

| | | |
|---|---|---|
| 8,722,498 B2 | 5/2014 | Scheiper et al. |
| 8,766,364 B2 | 7/2014 | Doornbos et al. |
| 8,847,281 B2 | 9/2014 | Cea et al. |
| 9,064,932 B1 | 6/2015 | Pham et al. |
| 9,093,496 B2 | 7/2015 | Jacob et al. |
| 9,269,628 B1 | 2/2016 | Jacob |
| 2014/0001572 A1 | 1/2014 | Bohr et al. |
| 2015/0024572 A1 | 1/2015 | Jacob et al. |
| 2015/0325482 A1* | 11/2015 | Hu ................... H01L 21/308 257/401 |

* cited by examiner

1100

1200

1300

1400

PRESERVING CHANNEL STRAIN IN FIN CUTS

BACKGROUND

The present application relates to semiconductors, and more specifically, to techniques for forming semiconductor structures. Various types of field-effect transistor (FET) devices may be used in semiconductor structures, integrated circuits and other electronic devices. Fin FETs (FinFETs) are a type of FET device, where fins are patterned on a substrate.

SUMMARY

Embodiments of the invention provide techniques for preserving channel strain in fin cuts.

For example, in one embodiment a method of forming a semiconductor structure comprises forming a fin cut mask over a region in a finFET structure. The finFET structure comprises one or more fins and one or more gates and source/drain regions formed over the one or more fins in active regions of the finFET structure. The method also comprises performing a fin cut by removing a portion of at least one of the fins. The portion of said at least one fin is determined by an exposed area of the fin cut mask. The exposed area of the fin cut mask comprises at least a portion of said at least one fin between a first dummy gate and a second dummy gate formed over said at least one fin. The method further comprises removing the fin cut mask and depositing an oxide to replace the portion of said at least one fin removed during the fin cut.

In another embodiment, a semiconductor structure comprises a finFET structure, at least one fin cut and an oxide layer. The finFET structure comprises one or more fins and one or more gates and source/drain regions formed over the one or more fins in active regions of the finFET structure. Said at least one fin cut is between a first gate structure and a second gate structure formed over at least one of the fins. The oxide layer is formed between adjacent portions of said at least one fin between the first gate structure and the second gate structure. The first gate structure comprises a first dummy gate formed over said at least one fin and a first gate patterning mask formed over the first dummy gate. The second gate structure comprises a second dummy gate formed over said at least one fin and a second gate patterning hard mask formed over the second dummy gate. Spacers are formed on sidewalls of the first gate structure and the second gate structure.

In another embodiment, a semiconductor structure comprises a finFET structure, at least one fin cut and an oxide layer. The finFET structure comprises one or more fins and one or more gates and source/drain regions formed over the one or more fins in active regions of the finFET structure. Said least one fin cut is between a first gate structure and a second gate structure formed over at least one of the fins. The oxide layer is formed between adjacent portions of said at least one fin between a pair of spacers, a first one of the pair of spacers being part of a first gate structure and a second one of the pair of spacers being part of a second gate structure. The first gate structure comprises at least a portion of a first gate patterning hard mask formed over a first dummy gate, the first dummy gate being removed when performing the fin cut. The second gate structure comprises at least a portion of a second gate patterning hard mask formed over a second dummy gate, the second dummy gate being removed when performing the fin cut.

DETAILED DESCRIPTION

Figure 1:
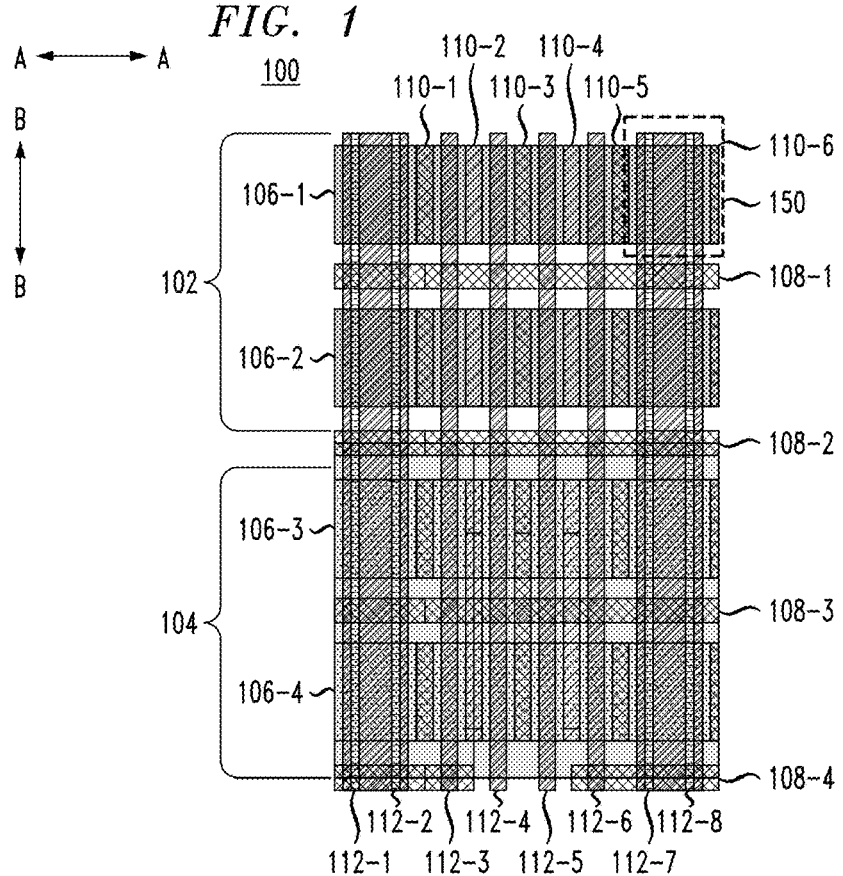
FIG. 1 depicts a top-down view of a semiconductor structure, according to an embodiment of the invention.

Illustrative embodiments of the invention may be described herein in the context of illustrative methods for preserving channel strain in fin cuts, along with illustrative apparatus, systems and devices having fin cuts formed using such methods. However, it is to be understood that embodiments of the invention are not limited to the illustrative methods, apparatus, systems and devices but instead are more broadly applicable to other suitable methods, apparatus, systems and devices.

In three-dimensional (3D) semiconductor structures such as semiconductor structure with fins, the fins are initial formed with high strain. When the fins in such structure are cut to form devices such as fin field-effect transistors (FinFETs), there is a loss in strain. The earlier the fins are cut, the greater the loss in strain. Thus, it would be desirable in methods for forming fin structures to cut fins later in the process. For example, performing the fin cut after gate and epitaxial source/drain formation can reduce the fin length dependent strain loss observed when cutting the fins. Advantageously, preserving or retaining channel strain preserves carrier mobility and the on current, $I_{on}$, realizing various performance benefits. For example, preserving the channel strain can results in 1-10% increases in the drive current with no additional leakage current in some embodiments.

Performing channel or fin cuts later in the formation of a semiconductor structure allows for minimizing or reducing spacer etching or pulldown during CT reactive-ion etching (RIE). CT refers to a sequence of processing steps involving deposition, lithography, and dry and wet etches where a dummy gate is patterned into its final dimension. Gate corners are more susceptible to damage and erosion, which can lead to epitaxial nodule growth on exposed dummy gates, which may be formed of amorphous silicon (a-Si). Performing channel or fin cutes later in a process also helps to prevent shorting of the gate-CA/TS due to more robust spacers downstream in contact formation during self-aligned contact etching. CA/TS refers to a sequence of steps where a metal thin film is inserted between gates to contact source/drain epitaxial films. When this is done, care should be taken to avoid contact of the metal thin film to the gate material, as such contact can cause an electrical short.

Performing channel or fin cuts later in processing or formation of a semiconductor structure also enables a single diffusion break at tighter ground rules. This can be advantageous, for example, in fin cuts through the gate and dielectric fill for structures using a single diffusion break (SDB). When using a SDB, the length of the fin cut is very small, such as less than 30 nm in some embodiments. Advantageously, use of SDB enables better control for fin cuts in short lengths of the fin since the process can be self-aligned to the gates.

Also, embodiments can provide for reducing the end capacitance of a semiconductor structure by performing channel or fin cuts later in the processing or formation of the structure. Compared with earlier fin cuts, embodiments provide for longer fin length, such as fin length that is longer by ½ the gate width and spacer thickness. As additional features, embodiments enable only one side of a spacer to be preserved, can completely remove gate wrapping around a fin, and/or can at least partially preserve materials that are used for gate patterning after fin cuts.

FIG. 1 shows a top-down view 100 of a semiconductor structure. As shown, the semiconductor structure includes a negative field-effect transistor (NFET) region 102 and a positive field-effect transistor (PFET) region 104. The semiconductor structure shown in FIG. 1 includes four active area masks 106-1, 106-2, 106-3 and 106-4 collectively referred to herein as active area masks 106. The active area masks 106, as their name indicates, are masks that define active areas of a structure. Each of the active areas may comprise one or more multiple fins. The fins may be contained in the active areas defined by active area masks 106, but are not shown in FIG. 1 for clarity. Fins contained in the active areas can be 10-10,000 nm in length as measured in direction A-A and may be 6-100 nm in width as measured in direction B-B in some embodiments. The active areas 106 may be formed of silicon (Si), silicon germanium (SiGe), gallium arsenide (GaAs) or various other semiconducting materials. Although FIG. 1 shows an example where each of the active area masks 106 is the same size, this is not a requirement. Two or more different active area masks in a semiconductor structure may have different lengths, widths and/or heights.

As shown, there are two active area masks 106-1 and 160-2 in the NFET region 102 and two active area masks 106-3 and 160-4 in the PFET region 104. The particular number of active area masks 106 may be selected as desired for a particular application, and embodiments are not limited to the specific example shown in FIG. 1. For example, more or fewer than four active area masks may be used, as well as more or fewer than two active area masks in NFET and PFET regions of a structure. Also, while FIG. 1 shows an example wherein there are the same number of active area masks in each of the NFET and PFET regions, this is not a requirement.

The FIG. 1 structure also shows a number of gate cut masks 108-1, 108-2, 108-3 and 108-4, collectively referred to herein as gate cut masks 108. The gate cut masks 108 may be lithography layers used to define the region of the gates that will be cut. Once the gate cut masks 108 are used and the appropriate process sequence followed, the gates will no longer be continuous across multiple active area masks 106.

In some embodiments, the gate cut masks 108 may have a length, measured in direction A-A, in the range of 20-2000 nm. The gate cut masks 108 may have a width, measured in direction B-B, in the range of 10-100 nm in some embodiments. Each of the gate cut masks 108 in FIG. 1 is shown as being equal in size, but this is not a requirement and in other embodiments different ones of the gate cut masks 108 may have different lengths, widths and/or heights.

The FIG. 1 structure includes a number of contacts 110-1, 110-2, 110-3, 110-4, 110-5 and 110-6, collectively referred to herein as contacts 110. The contacts 110 may be formed of varying materials, such tungsten (W), tungsten alloys, copper (Cu), cobalt (Co), etc. in some embodiments. Different ones of the contacts 110 are shown with different shading to indicate that they are formed using multiple lithography steps. For example, contacts 110-1, 110-2, 110-5 and 110-6 may be formed in one lithography step while contacts 110-2 and 110-4 may be formed in another lithography step.

As shown, certain of the contacts 110 are formed such that they span only a single one of the active areas masks 106. For example, contacts 110-1, 110-5 and 110-6 are formed in each of the active area masks 106 but do not span any two of the active area masks 106. Other contacts, however, may span multiple active area masks. Contacts 110-2, 110-3 and 110-4 are shown as not spanning active area masks 106-1 and 106-2, but do span and connect active area masks 106-3 and 106-4 as shown. More generally, different ones of the contacts 110 may span one or more multiple fins. Each contact 110 may have a length, measured in direction B-B, that depends on the width of the active area mask 106 that it contacts as well as depending on the number of active area masks 106 which that contact spans. Each contact 110 may have a width, measured in direction A-A, in the range of 10-2000 nm in some embodiments. Although not explicitly shown in FIG. 1, source/drain regions are formed underneath the contacts 110.

Each of the contacts 110 in FIG. 1 is shown as having the same width and height, but this is not a requirement and in other embodiments different ones of the contacts may have different widths and/or heights in addition to having different lengths as described.

The FIG. 1 structure also includes a number of gates 112-1, 112-2, 112-3, 112-4, 112-5, 112-6, 112-7 and 112-8 collectively referred to herein as gates 112. The gates 112 may be formed of polycrystalline Si, a-Si, amorphous Carbon (C), etc. in some embodiments. Each of the gates 112, before fin cuts, may have a length, measured in direction B-B, in the range of 10-10000 nm in some embodiments, which is based on the overall size of the FIG. 1 structure. Each of the gates 112 may have a width, measured in direction A-A, in the range of 5-500 nm in some embodiments. Each of the gates 112 may have a height, measured in the top-down direction of FIG. 1, in the range of 10-500 nm in some embodiments. Although shown in FIG. 1 as being equal in size, different ones of the gates 112 may be of different sizes relative to one another in terms of length, width and/or height as desired.

Figure 2:
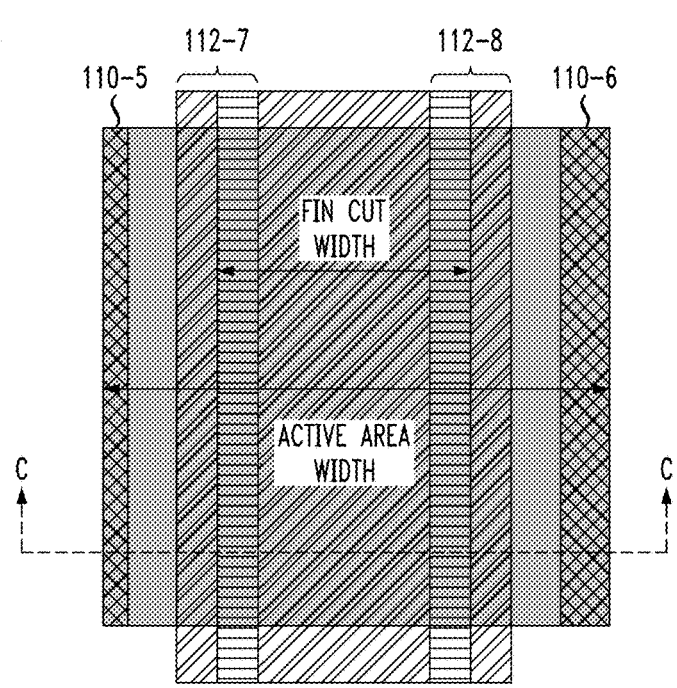
FIG. 2 depicts a top-down view of an active area of the FIG. 1 semiconductor structure, according to an embodiment of the invention.
Figure 4:
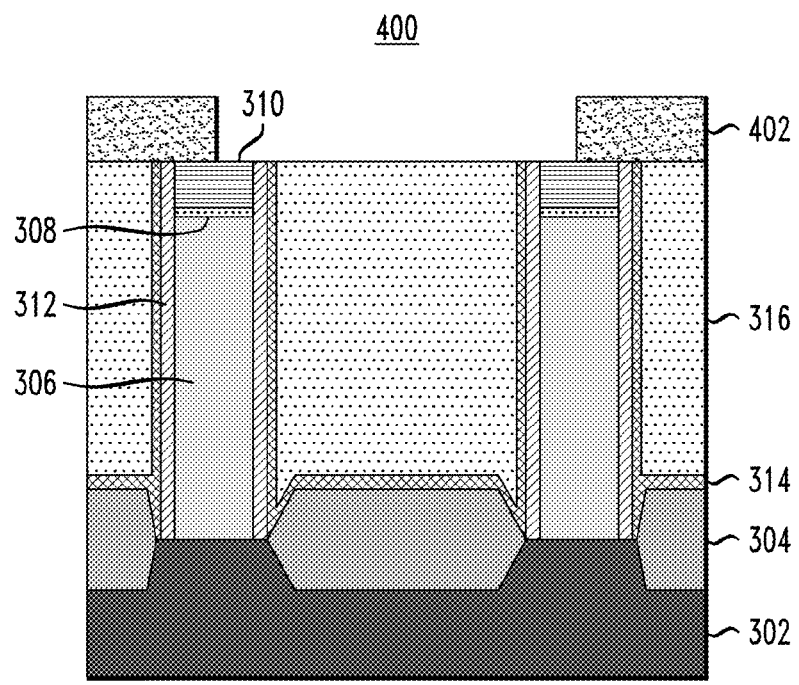
FIG. 4 depicts a side cross-sectional view of the FIG. 3 semiconductor structure with a fin cut mask, according to an embodiment of the present invention.
Figure 5:
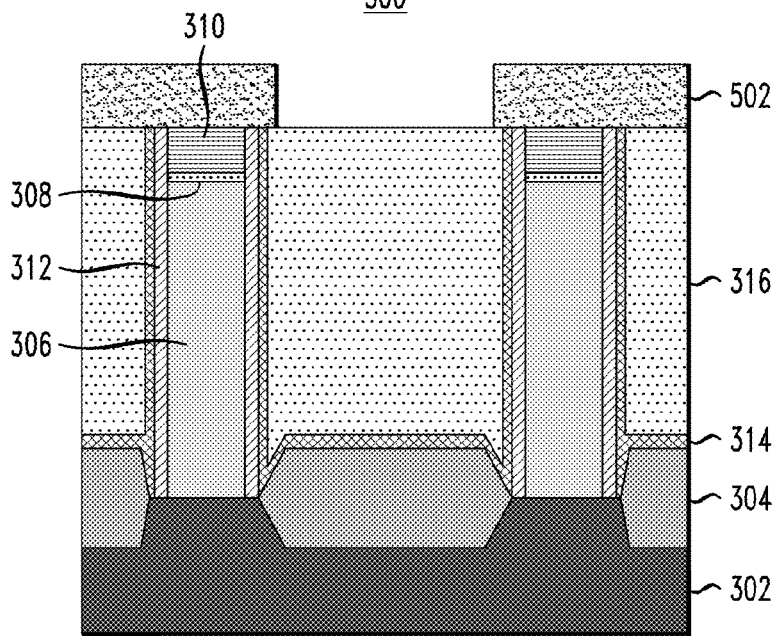
FIG. 5 depicts a side cross-sectional view of the FIG. 3 semiconductor structure with another fin cut mask, according to an embodiment of the present invention.
Figure 6:
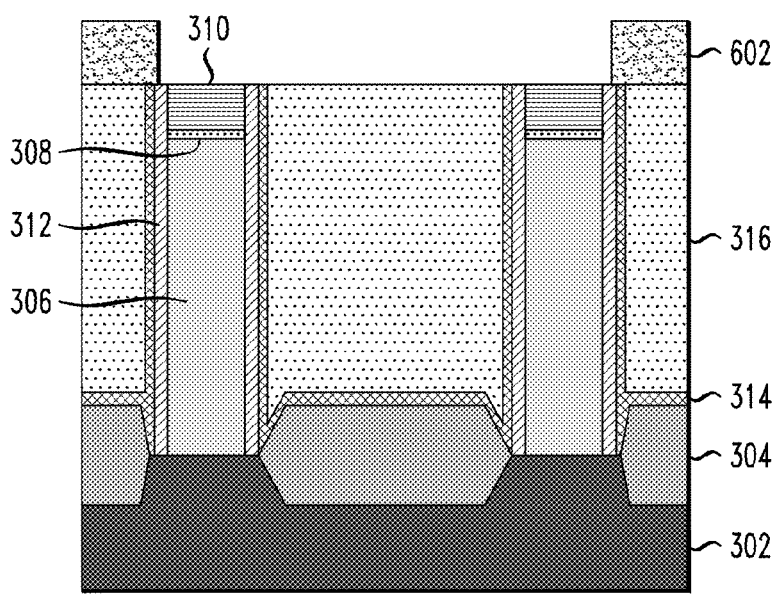
FIG. 6 depicts a side cross-sectional view of the FIG. 3 semiconductor structure with another fin cut mask, according to an embodiment of the present invention.

FIG. 1 shows, in a dashed outline box, a sample active region 150. FIG. 2 shows a close-up top-down view of the active region 150. The active region 150 has a width, in direction A-A of FIG. 1, spanning between and including portions of contacts 110-5 and 110-6. The active region 150 has a fin cut width that spans between the centers of adjacent gates 112-7 and 112-8. The fin cut width, as will be described in further detail below with respect to FIGS. 4-6, is not required to span between centers of adjacent ones of the gates 112.

FIGS. 3-13 below depict side cross-sectional views of an active region of a semiconductor structure, and detail sample processes for forming fin cuts in such structures. The cross-sectional views shown in FIGS. 3-13 are taken in a direction C-C shown in FIG. 2 for active region 150, although the structures shown in FIGS. 3-13 are shown before formation of contacts and do not use the same reference numerals as FIGS. 1 and 2 for clarity of illustration.

Figure 3:
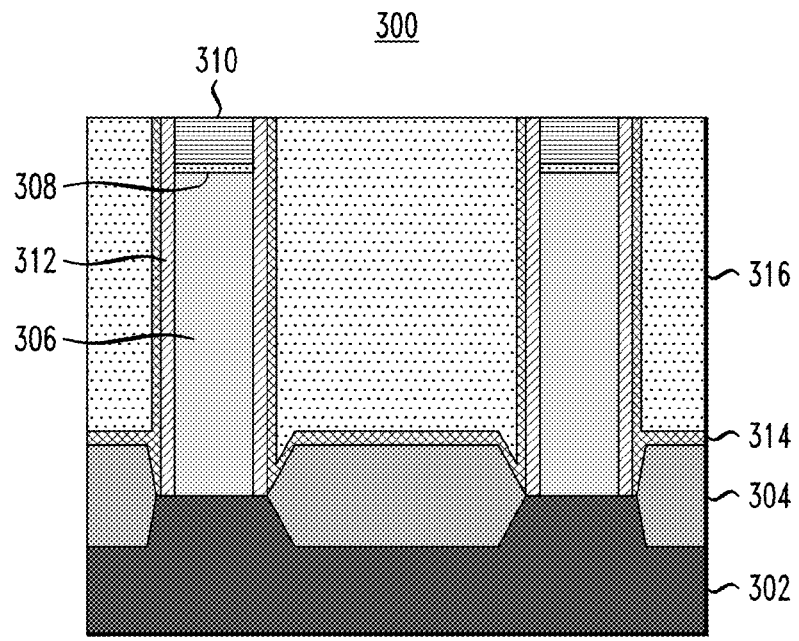
FIG. 3 depicts a side-cross sectional view of a semiconductor structure, according to an embodiment of the present invention.

FIG. 3 depicts a side cross-sectional view 300 of an active region of a semiconductor structure 300 after flowable chemical vapor deposition (FVCD). The FIG. 3 structure includes a substrate 302, source/drain regions 304, dummy gates 306, sacrificial layers 308 and 310 formed over the gates 306, spacers 312 surrounding the dummy gates 306 and sacrificial layers 308 and 310, a poly open CMP layer 314 surrounding spacers 312 and formed over source/drain regions 304, and oxide 316 between the poly open CMP layer 314. To form the FIG. 3 structure, the substrate 302 or fin is first formed, followed by formation of the dummy gates 306 and source/drain epitaxy.

The substrate 302 is a fin structure, and may be formed of Si, SiGe or GaAs in some embodiments. Source/drain epitaxial layers 304 are formed over the substrate 302 between the dummy gates 306. Source/drain epitaxial layers 304 may be formed of Si, SiGe, germanium (Ge), GaAs or silicon phosphide (SiP) in some embodiments. Source/drain epitaxial layers 304 may have widths in the range of 10-1000 nm and heights in the range of 10-100 nm in some embodiments.

Dummy gates 306 may be formed of silicon, polysilicon, a-Si or C in some embodiments. Dummy gates 306 may have widths in the range of 10-500 nm and heights in the range of 10-200 nm in some embodiments. Sacrificial layers 308 and 310 provide a gate patterning hard mask. Sacrificial layer 308 may be an oxide with sacrificial layer 310 being a nitride, or vice versa. Although sacrificial layer 308 is shown having a smaller height than sacrificial layer 310 in FIG. 3, this is not a requirement. The relative heights of sacrificial layers 308 and 310 may vary as desired, with their total height being in the range of 2-50 nm in some embodiments.

Spacers 312 may be nitride spacers in some embodiments, although other suitable materials may be used in other embodiments. The spacers 312 may have a thickness in the range of 2-20 nm in some embodiments. Poly open CMP layer 314 surrounds the spacers 312 and the tops and sides of source/drain epitaxial layers 304 that extend above the top of the substrate 302. Poly open CMP layer 314 may be formed of nitride or another dielectric film that is sufficiently different in properties from oxide such that it may be removed selective to oxide. Poly open CMP layer 314 may have a thickness in the range of 2-50 nm in some embodiments. The poly open CMP layer 314 is an optional layer, which may be excluded in some embodiments such that there is one less film to etch before exposing the underlying epitaxial film.

FIGS. 4-6 show the FIG. 3 structure following formation of fin cut masks 402, 502 and 602, respectively. The fin cut masks 402, 502 and 602 may be photoresists or other patterning layers including but not limited to an organic polymer layer (OPL), a Silicon-Containing Anti-Reflective Coating (SiARC), a Titanium-Containing Anti-Reflective Coating (TiARC), other hard mask materials, etc. that are patterned as shown in FIGS. 4-6, respectively. The openings in fin cut masks 402, 502 and 602 may span from 10-10,000 nm in some embodiments.

FIG. 4 shows a side cross-sectional view 400 of the FIG. 3 structure following formation of fin cut mask 402 that exposes approximately half of the gate masks for dummy gates 306, and corresponds to the fin cut mask illustrated in active region 150 shown in FIGS. 1 and 2. FIG. 5 shows a side cross-sectional view 500 of the FIG. 3 structure following formation of fin cut mask 502 that exposes none of the gate masks for dummy gates 306, such that only the oxide 316 between the dummy gates 306 is exposed. FIG. 6 shows a side cross-sectional view 600 of the FIG. 3 structure following formation of fin cut mask 602 that exposes all of the gate masks for dummy gates 306.

FIGS. 4-6 show three possible options for forming a fin cut mask. Embodiments, however, are not limited to the specific examples shown in FIG. 4-6. Fin cut masks may vary between exposing all or none of the gate masks as desired for a particular application. FIGS. 7-13 show processing steps performed after forming the fin cut mask 402 shown in FIG. 4, but similar steps may be used with other fin cut masks as will be detailed below.

Figure 7:
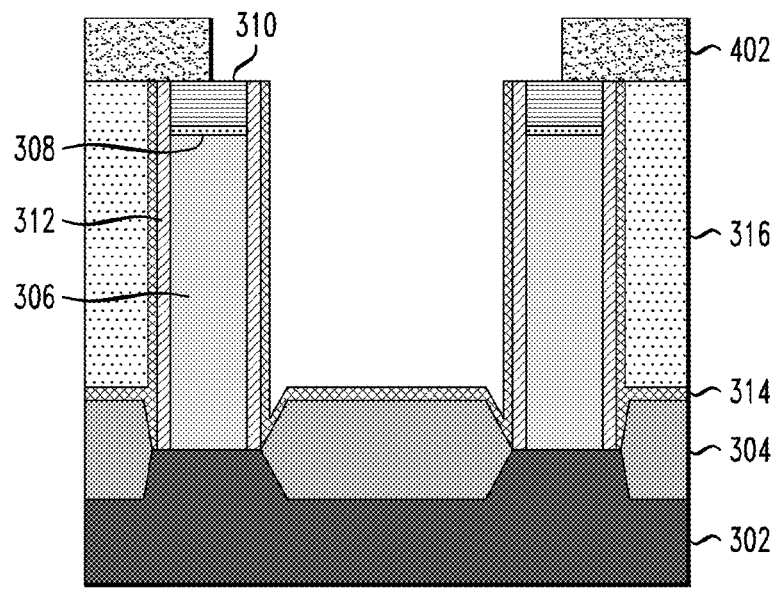
FIG. 7 depicts a side cross-sectional view of the FIG. 4 structure following a dry etch, according to an embodiment of the present invention.

FIG. 7 shows a side cross-sectional view 700 of the FIG. 4 structure following a buffered oxide (BHF) etch, which etches the oxide 316 exposed by fin cut mask 402. The BHF etch may use a mixture of hydrofluoric acid (HF) and a buffering agent such as ammonium fluoride ($NH_4F$). BHF is used in a wet etch process, but dry etches may be also be used in some embodiments. In this particular example, the BHF etch may be 150 nm to expose the poly open CMP 314 on the source/drain epitaxial layer 304 formed between the dummy gates 306.

Figure 8:
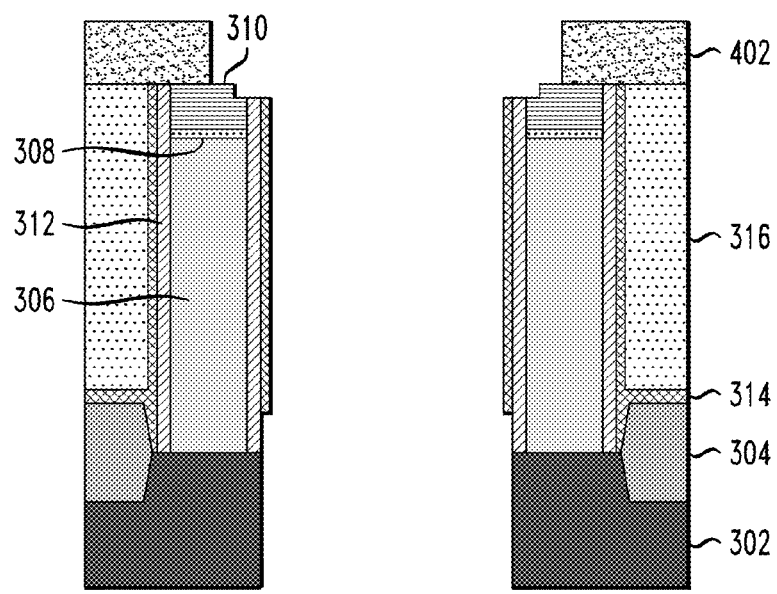
FIG. 8 depicts a side cross-sectional view of the FIG. 7 structure following a nitride and silicon etch, according to an embodiment of the present invention.
Figure 9:
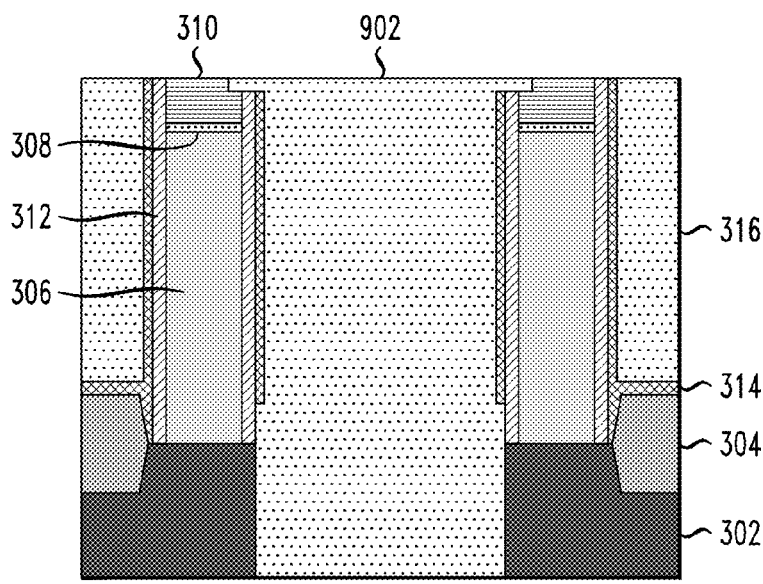
FIG. 9 depicts a side cross-sectional view of the FIG. 8 structure following removal of the fin cut mask and deposition of an oxide, according to an embodiment of the present invention.
Figure 10:
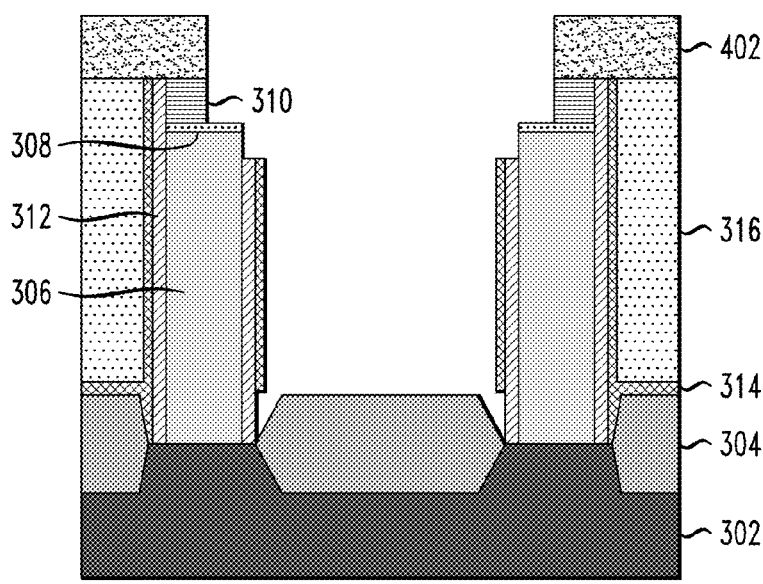
FIG. 10 depicts a side cross-sectional view of the FIG. 7 structure following a nitride open, according to an embodiment of the present invention.

FIGS. 8-10 show a first process, whereby the fin length is longer by half the width of the fin cut mask 402 and the spacer 312 thickness as compared to an early fin cut.

FIG. 8 shows a side cross-sectional view 800 of the FIG. 7 structure following nitride and silicon etches. The nitride etch removes the poly open CMP 314 on the top of the source/drain epitaxial layer 304 between dummy gates 306.

This nitride etch, as shown, will also form notches in the gate hard mask, spacer 312 and poly open CMP layer 314 on the sides of the dummy gates 306. The nitride etch may be substantially directional, such that the poly open CMP layer 314 on the sidewalls of the spacers 312 surrounding dummy gates 306 remains mostly intact as shown. The nitride etch may comprise a dry etch such as RIE in some embodiments.

Following the nitride etch, a silicon etch is used to remove the source/drain epitaxial layer 304 between dummy gates 306 as well as to form the fin cut in substrate 302. The silicon etch may utilize the same dry etch or ME used to remove the poly open CMP layer 314. If different etch chemistries are required to remove the poly open CMP layer 314 and the source/drain epitaxial layer, they may be applied in an appropriate sequence so as to remove the materials as illustrated.

FIG. 9 shows a side-cross-sectional view 900 of the FIG. 8 structure following removal of the fin cut mask 402 and deposition of an oxide 902 between the dummy gates 306 and ends of the substrate 302 exposed by the fin cut. The fin cut mask 402 may be removed using a wet or dry etch selective to other materials that the removal chemistry is exposed to, such as the materials of elements 310, 312 and 316. The oxide 902 may be formed by FCVD deposition following by CMP.

FIGS. 7 and 10-13 show a second process, whereby spacers 312 on only one side of the dummy gates 306 are preserved. The dummy gates 306 are completely removed, and thus there is no gate wrapping around the fin. As shown, the sacrificial layers 308 and 310 used for gate patterning are partially preserved after the fin cut.

FIG. 10 shows a side cross-sectional view 1000 of the FIG. 7 structure, following a nitride open that exposes the dummy gates 306 as shown. The nitride open may comprise a nitride etch similar to that described above with respect to FIG. 8, but with the nitride etch being applied longer such that all of the sacrificial layer 310 is removed along with a portion of the spacers 312 and poly open CMP layer 314 on the sidewalls of the spacers 312 such that the dummy gates 306 are exposed. The nitride open, similar to the nitride etch described above with respect to FIG. 8, may be substantially directional such that only a portion of the spacers 312 and the poly open CMP layer 314 on the sidewalls of the spacers 312 is removed.

Figure 11:
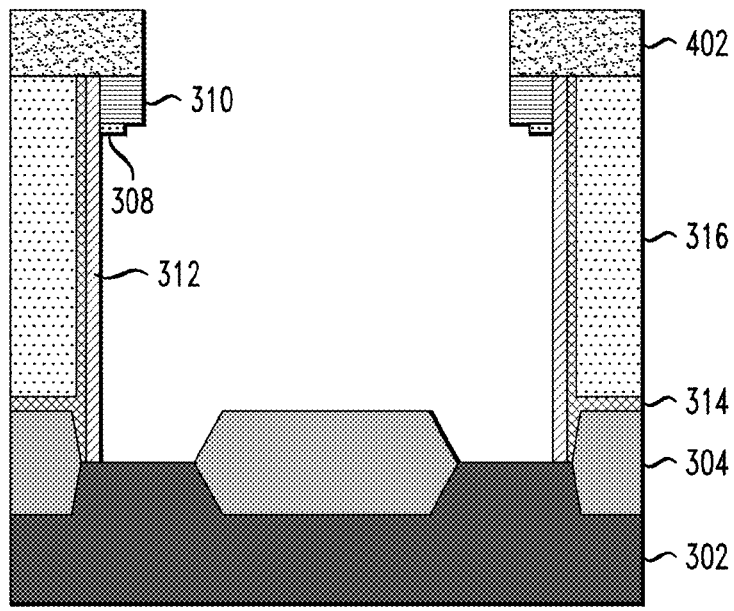
FIG. 11 depicts a side cross-sectional view of the FIG. 10 structure following a polysilicon pull and nitride etch, according to an embodiment of the present invention.

FIG. 11 shows a side cross-sectional view 1100 of the FIG. 10 structure following poly pull and nitride RIE processes, which may be similar to the nitride and silicon etch processes described above. The particular etch chemistry may vary depending on the type of nitride or other material being etched. The nitride RIE processing is performed first, such that the remaining poly open CMP layer 314 and spacers 312 between dummy gates 306 is removed. This process may use a directional or anisotropic process that etches materials it is directly exposed to. Since the poly open CMP layer 314 is directly exposed to the RIE chemistry it will etch faster than the spacers 312 where only the top is exposed. Thus, the spacer 312 etches from the top whereas the poly open CMP layer 314 etches from the top and the sides. Following the nitride RIE, a poly pull process is formed to remove the dummy gates 306. The poly pull process, as shown, does not remove the source/drain epitaxial layer between the dummy gates 306 in some embodiments. This is due to the chemistry used. For example, various chemistries etch the polysilicon of the dummy gates 306 much faster than the source/drain epitaxial layer 304, and thus the impact of the poly pull on the source/drain epitaxial layer 304 between the dummy gates 306 is minimal.

Figure 12:
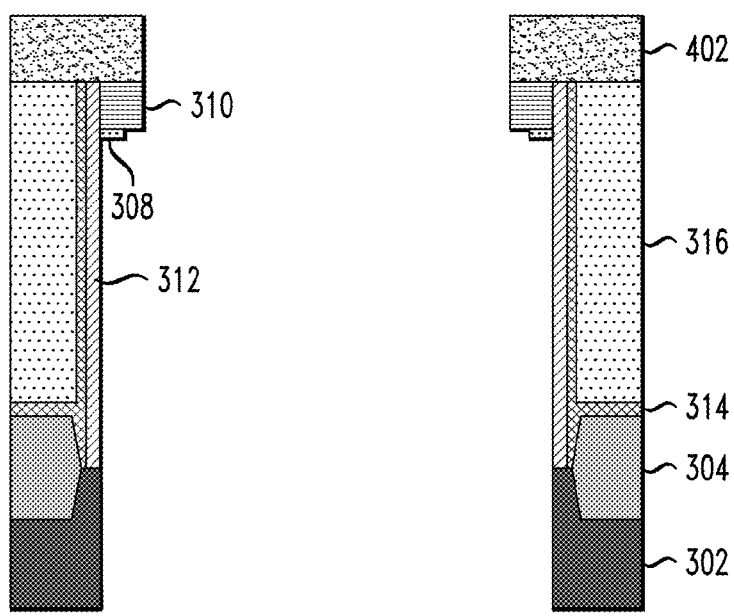
FIG. 12 depicts a side cross-sectional view of the FIG. 11 structure following a silicon etch, according to an embodiment of the present invention.

FIG. 12 shows a side cross-sectional view 1200 of the FIG. 11 structure following a silicon etch, similar to the silicon etch described with respect to FIG. 8, that removes the source/drain epitaxial layer 304 between the dummy gates 306 and forms the fin cut in substrate 302.

Figure 13:
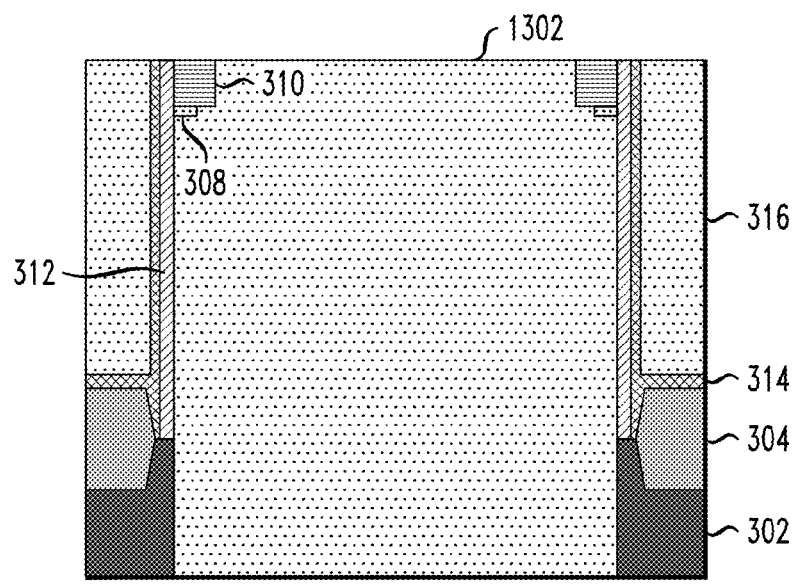
FIG. 13 depicts a side cross-sectional view of the FIG. 12 structure following removal of the fin cut mask and deposition of an oxide, according to an embodiment of the present invention.

FIG. 13 shows a side cross-sectional view 1300 of the FIG. 12 structure following removal of the fin cut mask 402 and deposition of an oxide 1302 between the spacers 312 and ends of the substrate 302 exposed by the poly pull and fin cut. The fin cut mask 402 may be removed using techniques similar to that described above with respect to FIG. 9. The oxide 1302 may be formed by FCVD deposition followed by CMP.

Figure 14:
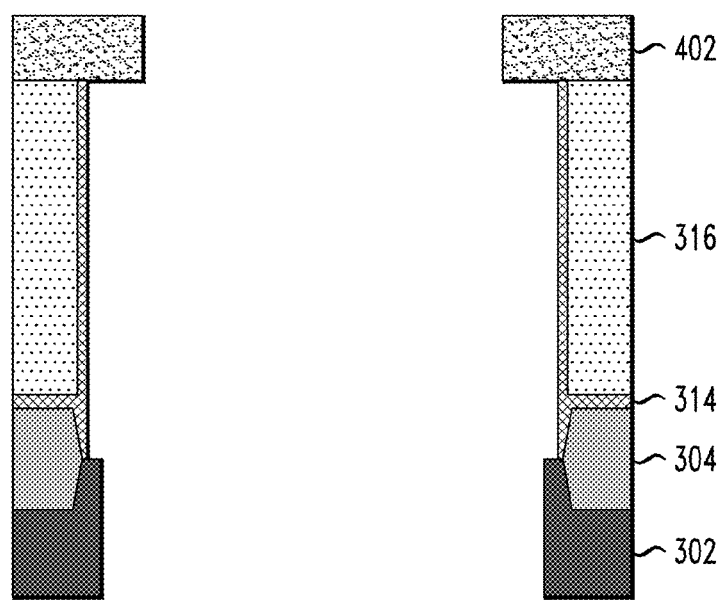
FIG. 14 depicts a side cross-sectional view of the FIG. 12 structure following removal of the remaining gate patterning hard mask and spacers, according to an embodiment of the present invention.
Figure 15:
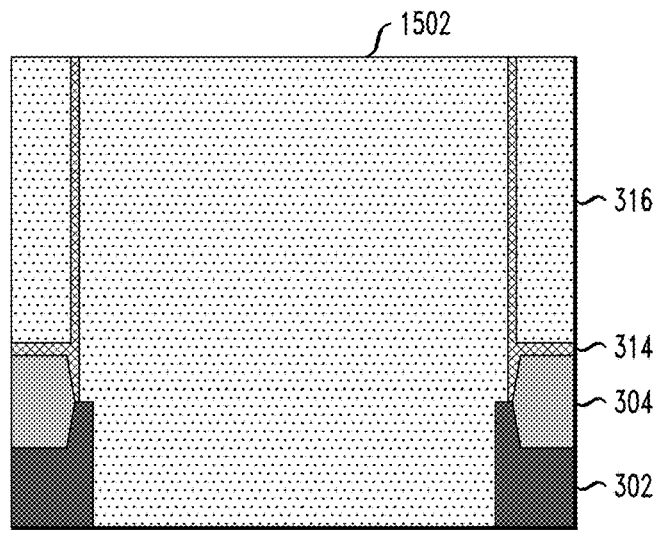
FIG. 15 depicts a side cross-sectional view of the FIG. 14 structure, following removal of the fin cut mask and deposition of an oxide, according to an embodiment of the present invention.

FIGS. 14 and 15 depict an alternative embodiment of the second process, wherein additional dry or wet etches are used to remove the gate patterning hard masks as well as the remaining spacers 312. Removing the remaining portions of the gate patterning hard masks, including the remaining portions of the sacrificial layers 308 and 310 along with removing the remaining spacers 312 left exposed by removal of the dummy gates 306 may provide certain advantages in reducing the parasitic capacitance of the resulting structure. The extent of this benefit, however, may depend on the layout of the rest of the structure as well as the materials choices for the spacers 312, poly open CMP layer 314 and the eventual dielectric fill used, e.g., the oxide 1502 described below.

FIG. 14 shows a side cross-sectional view 1400 of the FIG. 12 structure following such additional etching, whereby the remaining spacers 312 left exposed by removal of the dummy gates 306 are removed along with the remaining portions of the sacrificial layers 308 and 310 of the gate patterning hard masks.

FIG. 15 shows a side cross-sectional view 1500 of the FIG. 14 structure following removal of the fin cut mask 402 and deposition of an oxide 1502 to fill in the area removed during the fin cut.

Although not explicitly shown in FIGS. 14 and 15, the poly open CMP layer 314 that surrounding the remaining spacers 312 left exposed by removal of the dummy gates 306 may also be removed depending on the particular etch processes and chemistries used.

Figure 16:
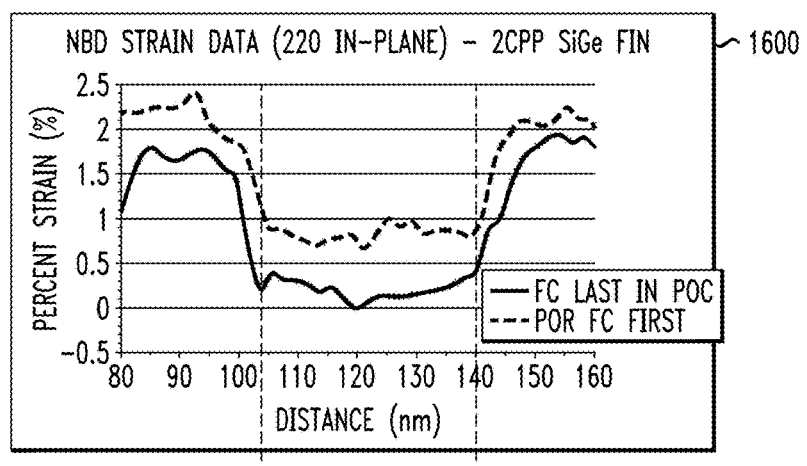
FIG. 16 depicts a plot and semiconductor structure illustrating channel strain preservation, according to an embodiment of the present invention.
Figure 16:
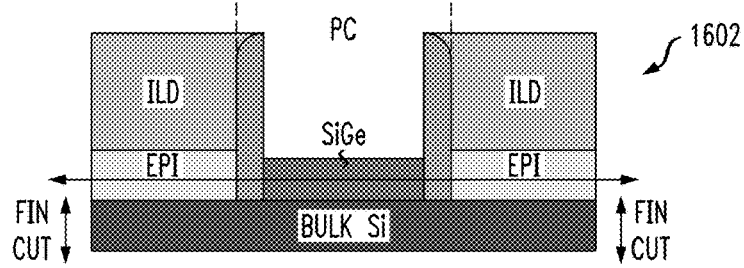

FIG. 16 depicts a plot 1600 showing in-plane strain data for crystalline orientation 220 in-plane for a SiGe fin. The plot 1600 shows the percent strain loss percentage in the y-axis as a function of distance in nanometers (nm) for device 1602. The plot 1600 shows the percent strain loss, where lower is better, for performing fin cut last as described above and also for a conventional technique wherein the fin is cut prior to formation of the FIG. 3 structure described above. The device 1602, as illustrated, has fin cuts at the left and right edges of the bulk silicon substrate. A SiGe gate is formed between spacers and epitaxial layers. Interlayer dielectric is formed over the epitaxial layers. The plot 1600 illustrates strain preservation by forming fin cuts later in processing as described.

In some embodiments, a method for forming a semiconductor structure comprises forming a fin cut mask over a region in a finFET structure, where the finFET structure comprises one or more fins and one or more gates and source/drain regions formed over the one or more fins in active regions of the finFET structure. The method includes performing a fin cut by removing a portion of at least one of the fins, the portion of said at least one fin being determined by an exposed area of the fin cut mask, the exposed area of the fin cut mask comprising at least a portion of said at least one fin between a first dummy gate and a second dummy gate formed over said at least one fin. The method also includes removing the fin cut mask and depositing an oxide to replace the portion of said at least one fin removed during the fin cut.

The fin cut mask, in some embodiments, covers at least a portion of a first gate structure comprising the first dummy gate and at least a portion of a second gate structure comprising the second dummy gate. The fin cut mask in such embodiments exposes an area between the first gate structure and the second gate structure while partially exposing tops of the first gate structure and the second gate structure. FIG. 4 illustrates an example of such embodiments. In other embodiments, the fin cut mask covers all of the first gate structure comprising the first dummy gate and all of the second gate structure comprising the second dummy gate. In such embodiments the fin cut mask exposes an area between the first gate structure and the second gate structure without exposing tops of the first gate structure or the second gate structure. FIG. 5 illustrates an example of such embodiments. In still other embodiments, the fin cut mask exposes the first gate structure comprising the first dummy gate, the second gate structure comprising the second dummy gate, and an area between the first gate structure and the second gate structure. FIG. 6 illustrates an example of such embodiments.

In some embodiments, such as those illustrated in FIGS. 7-9, the first dummy gate and the second dummy gate are retained following the fin cut. In other embodiments, such as those illustrated in FIGS. 7 and 10-13, the first dummy gate and the second dummy gate are removed during the fin cut. In such embodiments, portions of a first gate patterning stack formed over the first dummy gate and portions of a second gate patterning stack formed over the second dummy gate are retained following the fin cut.

In some embodiments, performing the fin cut comprises etching to remove an oxide layer between a first gate structure and a second gate structure. The first gate structure comprises the first dummy date and a first gate patterning hard mask structure formed over the first dummy gate. The second gate structure comprises the second dummy gate and a second gate patterning hard mask structure formed over the second dummy gate. FIG. 7 illustrates an example of such processing.

As detailed above and as shown in FIGS. 8 and 9, in some embodiments performing the fin cut also comprises performing a directional nitride etch to remove a portion of the first gate patterning hard mask structure left exposed by the fin cut mask, the portion of the first gate patterning hard mask comprising a portion of a first sacrificial layer in the first gate patterning hard mask structure, to remove a portion of the second gate patterning hard mask structure left exposed by the fin cut mask, the portion of the second gate patterning hard mask comprising a portion of a second sacrificial layer in the second gate patterning hard mask structure, to remove portions of first spacers formed on sidewalls of the first gate structure and the second gate structure, and to remove portions of second spacers formed on sidewalls of the first spacers and over an epitaxial layer formed over said at least one fin between the first gate structure and the second gate structure. Performing the fin cut may also include performing an epitaxial and silicon etch to remove the epitaxial layer and the portion of said at least one fin between the first gate structure and the second gate structure. The removed portion of said at least one fin may comprise portions of said at least one fin not covered by the first spacers on sidewalls of the first gate structure and the second gate structure.

As detailed above and as shown in FIGS. 10-13, in some embodiments performing the fin cut comprises performing a directional nitride etch to remove a portion of the first gate patterning hard mask structure left exposed by the fin cut mask, the portion of the first gate patterning hard mask comprising all of a first sacrificial layer in the first gate patterning hard mask structure left exposed by the fin cut mask, to remove a portion of the second gate patterning hard mask structure left exposed by the fin cut mask, the portion of the second gate patterning hard mask comprising all of a second sacrificial layer in the second gate patterning hard mask structure left exposed by the fin cut mask, to remove portions of first spacers formed on sidewalls of the first gate structure and the second gate structure, and to remove portions of second spacers formed on sidewalls of the first spacers and over an epitaxial layer formed over said at least one fin between the first gate structure and the second gate structure. The removed portions of the first spacers and the second spacers expose at least a portion of the first dummy gate and at least a portion of the second dummy gate. Performing the fin cut may further comprise performing a nitride reactive-ion etching to remove the first spacers and the second spacers formed on sidewalls of the first gate structure and sidewalls of the second gate structure between the first dummy gate and the second dummy gate. Performing the fin cut may further comprise performing a poly pull to remove the first dummy gate and the second dummy gate, and performing an epitaxial and silicon etch to remove the epitaxial layer and the portion of said at least one fin between the remaining first spacers left exposed by removal of the first dummy gate and the second dummy gate.

In some embodiments, a semiconductor structure comprises a finFET structure comprising one or more fins and one or more gates and source/drain regions formed over the one or more fins in active regions of the finFET structure, at least one fin cut between a first gate structure and a second gate structure formed over at least one of the fins, and an oxide layer formed between adjacent portions of said at least one fin between the first gate structure and the second gate structure. The first gate structure comprises a first dummy gate formed over said at least one fin and a first gate patterning mask formed over the first dummy gate, the second gate structure comprises a second dummy gate formed over said at least one fin and a second gate patterning hard mask formed over the second dummy gate, and spacers are formed on sidewalls of the first gate structure and the second gate structure. Notches may be formed in at least a portion of the first gate patterning hard mask, the second gate patterning hard mask and the spacers. In some embodiments, the fin cut may extend in an area over said at least one fin between the first gate structure and the second gate structure but does not extend to an area of said at least one fin below the first gate structure and the second gate structure. The processing described with respect to FIGS. 7-9 may be used to form such a semiconductor structure in some embodiments.

In some embodiments, a semiconductor structure comprises a finFET structure comprising one or more fins and one or more gates and source/drain regions formed over the one or more fins in active regions of the finFET structure, at least one fin cut between a first gate structure and a second gate structure formed over at least one of the fins, and an oxide layer formed between adjacent portions of said at least one fin between a pair of spacers, a first one of the pair of spacers being part of a first gate structure and a second one of the pair of spacers being part of a second gate structure. The first gate structure comprises at least a portion of a first gate patterning hard mask formed over a first dummy gate, the first dummy gate being removed when performing the fin cut. The second gate structure comprises at least a portion of a second gate patterning hard mask formed over a second dummy gate, the second dummy gate being removed when performing the fin cut. Each of the first gate patterning hard mask and the second gate patterning hard mask may comprise a first sacrificial layer and a second sacrificial layer formed over the first sacrificial layer. One of the first sacrificial layer and the second sacrificial layer may comprise a nitride layer and the other one of the first sacrificial layer and the second sacrificial layer may comprise an oxide layer. In some embodiments, the fin cut extends in an area of the at least one fine between the first gate structure and the second gate structure as well as an area of the at least one fin below the first gate structure and the second gate structure. The processing described with respect to FIGS. 7 and 10-13 may be used to form such a semiconductor structure in some embodiments.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOSs), metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:

forming a fin cut mask over a region in a fin field-effect transistor (finFET) structure, the finFET structure comprising one or more fins and one or more gates and source/drain regions formed over the one or more fins in active regions of the finFET structure;

performing a fin cut by removing a portion of at least one of the fins, the portion of said at least one fin being determined by an exposed area of the fin cut mask, the exposed area of the fin cut mask comprising at least a portion of said at least one fin between a first dummy gate and a second dummy gate formed over said at least one fin;

wherein performing the fin cut comprises etching to remove an oxide layer between a first gate structure and a second gate structure, the first gate structure comprising the first dummy gate and a first gate patterning hard mask structure formed over the first dummy gate, the second gate structure comprising the second dummy gate and a second gate patterning hard mask structure formed over the second dummy gate; and wherein performing the fin cut further comprises performing a directional nitride etch:

to remove a portion of the first gate patterning hard mask structure left exposed by the fin cut mask, the portion of the first gate patterning hard mask comprising a portion of a first sacrificial layer in the first gate patterning hard mask structure;

to remove a portion of the second gate patterning hard mask structure left exposed by the fin cut mask, the portion of the second gate patterning hard mask comprising a portion of a second sacrificial layer in the second gate patterning hard mask structure;

to remove portions of first spacers formed on sidewalls of the first gate structure and the second gate structure; and to remove portions of second spacers formed on sidewalls of the first spacers and over an epitaxial layer formed over said at least one fin between the first gate structure and the second gate structure;

removing the fin cut mask; and depositing an oxide to replace the portion of said at least one fin removed during the fin cut.

2. The method of claim 1, wherein the fin cut mask covers at least a portion of a first gate structure comprising the first dummy gate and at least a portion of a second gate structure comprising the second dummy gate, and wherein the fin cut mask exposes an area between the first gate structure and the second gate structure.

3. The method of claim 1, wherein the fin cut mask covers all of a first gate structure comprising the first dummy gate and all of a second gate structure comprising the second dummy gate, and wherein the fin cut mask exposes an area between the first gate structure and the second gate structure.

4. The method of claim 1, wherein the fin cut mask exposes a first gate structure comprising the first dummy gate, a second gate structure comprising the second dummy gate, and an area between the first gate structure and the second gate structure.

5. The method of claim 1, wherein the first dummy gate and the second dummy gate are retained following the fin cut.

6. The method of claim 1, wherein the first dummy gate and the second dummy gate are removed during the fin cut, and wherein portions of a first gate patterning stack formed over the first dummy gate and portions of a second gate patterning stack formed over the second dummy gate are retained following the fin cut.

7. The method of claim 1, wherein performing the fin cut further comprises performing an epitaxial and silicon etch to remove the epitaxial layer and the portion of said at least one fin between the first gate structure and the second gate structure.

8. The method of claim 7, wherein the removed portion of said at least one fin comprises portions of said at least one fin not covered by the first spacers on sidewalls of the first gate structure and the second gate structure.

9. A method of forming a semiconductor structure, comprising:
    forming a fin cut mask over a region in a fin field-effect transistor (finFET) structure, the finFET structure comprising one or more fins and one or more gates and source/drain regions formed over the one or more fins in active regions of the finFET structure;
    performing a fin cut by removing a portion of at least one of the fins, the portion of said at least one fin being determined by an exposed area of the fin cut mask, the exposed area of the fin cut mask comprising at least a portion of said at least one fin between a first dummy gate and a second dummy gate formed over said at least one fin;
    wherein performing the fin cut comprises etching to remove an oxide layer between a first gate structure and a second gate structure, the first gate structure comprising the first dummy gate and a first gate patterning hard mask structure formed over the first dummy gate, the second gate structure comprising the second dummy gate and a second gate patterning hard mask structure formed over the second dummy gate; and
    wherein performing the fin cut comprises performing a directional nitride etch:
    to remove a portion of the first gate patterning hard mask structure left exposed by the fin cut mask, the portion of the first gate patterning hard mask comprising all of a first sacrificial layer in the first gate patterning hard mask structure left exposed by the fin cut mask;
    to remove a portion of the second gate patterning hard mask structure left exposed by the fin cut mask, the portion of the second gate patterning hard mask comprising all of a second sacrificial layer in the second gate patterning hard mask structure left exposed by the fin cut mask;
    to remove portions of first spacers formed on sidewalls of the first gate structure and the second gate structure; and
    to remove portions of second spacers formed on sidewalls of the first spacers and over an epitaxial layer formed over said at least one fin between the first gate structure and the second gate structure;
    wherein the removed portions of the first spacers and the second spacers expose at least a portion of the first dummy gate and at least a portion of the second dummy gate;
    removing the fin cut mask; and
    depositing an oxide to replace the portion of said at least one fin removed during the fin cut.

10. The method of claim 9, wherein performing the fin cut further comprises performing a nitride reactive-ion etching to remove the first spacers and the second spacers formed on sidewalls of the first gate structure and sidewalls of the second gate structure between the first dummy gate and the second dummy gate.

11. The method of claim 10, wherein performing the fin cut further comprises performing a poly pull to remove the first dummy gate and the second dummy gate.

12. The method of claim 11, wherein performing the fin cut further comprises performing an epitaxial and silicon etch to remove the epitaxial layer and the portion of said at least one fin between the remaining first spacers left exposed by removal of the first dummy gate and the second dummy gate.

* * * * *